United States Patent [19]

Archambault et al.

[11] 4,158,177
[45] Jun. 12, 1979

[54] PARAMETRIC COUPLING DEVICE FOR TRAVELING-WAVES

[75] Inventors: Yves Archambault; Bernard Epsztein; Bernard Le Clerc, all of Paris, France

[73] Assignee: Thomson-CSF, Paris, France

[21] Appl. No.: 915,128

[22] Filed: Jun. 13, 1978

[30] Foreign Application Priority Data

Jun. 17, 1977 [FR] France ............................. 77 18622

[51] Int. Cl.² ............................................... H03F 7/04
[52] U.S. Cl. ..................................... 330/4.6; 307/424
[58] Field of Search ....................... 330/4.6; 307/88.3

[56] References Cited

U.S. PATENT DOCUMENTS

| 3,008,089 | 11/1961 | Uhlir | 330/4.6 |
| 3,096,485 | 7/1963 | Chang | 330/4.6 |
| 3,169,225 | 2/1965 | Okwit | 330/4.6 |

*Primary Examiner*—Rudolph V. Rolinec
*Assistant Examiner*—Darwin R. Hostetter
*Attorney, Agent, or Firm*—Roland Plottel

[57] ABSTRACT

Parametric coupling device for traveling-waves, comprising a first signal wave, a second idler wave and a third pump wave, wherein a transmission line for said traveling-waves is formed on a substrate of dielectric material, which comprises a virtually continuous network of non-linear interaction elements, modulated by the pump wave, and so modulating the conduction properties of the transmission line and enabling intermodulation to be set up between the various traveling-waves. The virtually continuous network of non-linear interaction elements is a substantially plane network, each non-linear interaction element being at a distance a, or pitch of the network, from a neighbouring non-linear element, the distance a being less than the smallest of the wavelength of the signal, idler and pump waves and the plane network being disposed in the neighborhood of the upper surface of the transmission line.

9 Claims, 7 Drawing Figures

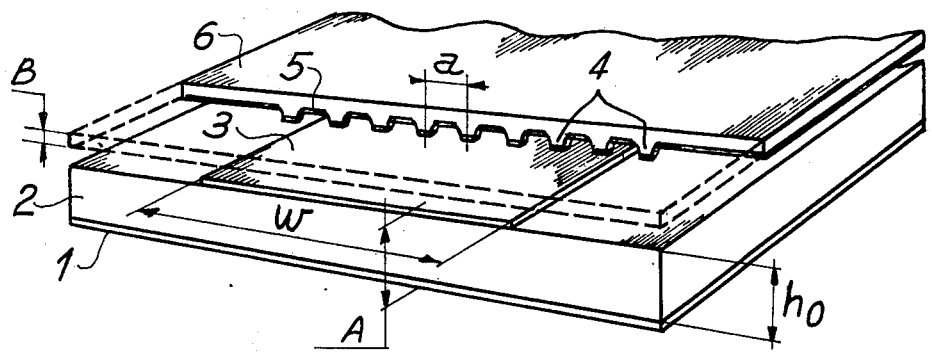
Fig_1a
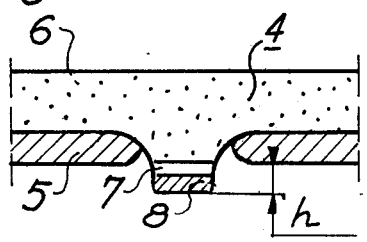
Fig_1b
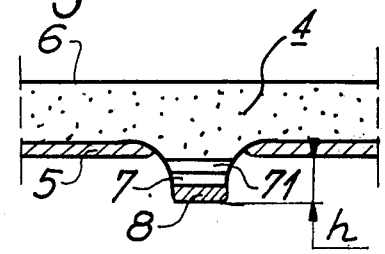
Fig_1c
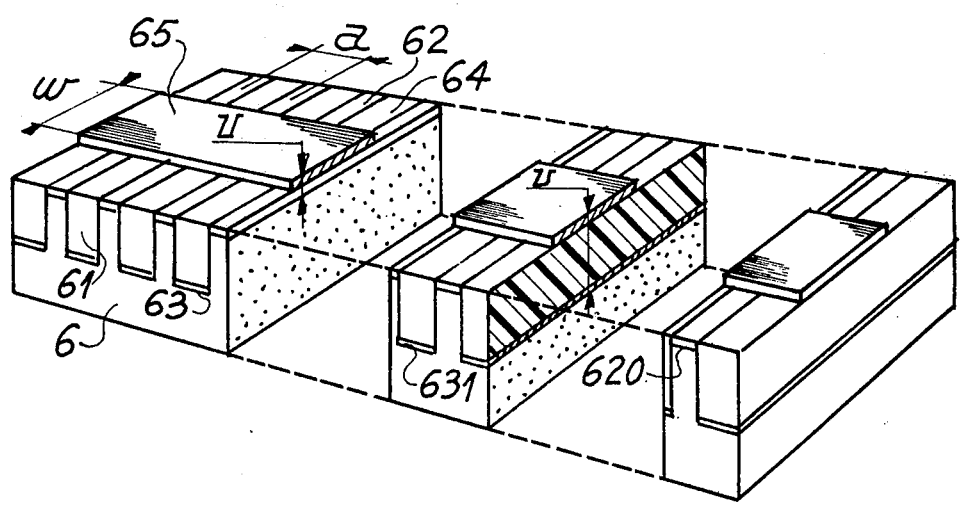
Fig_2

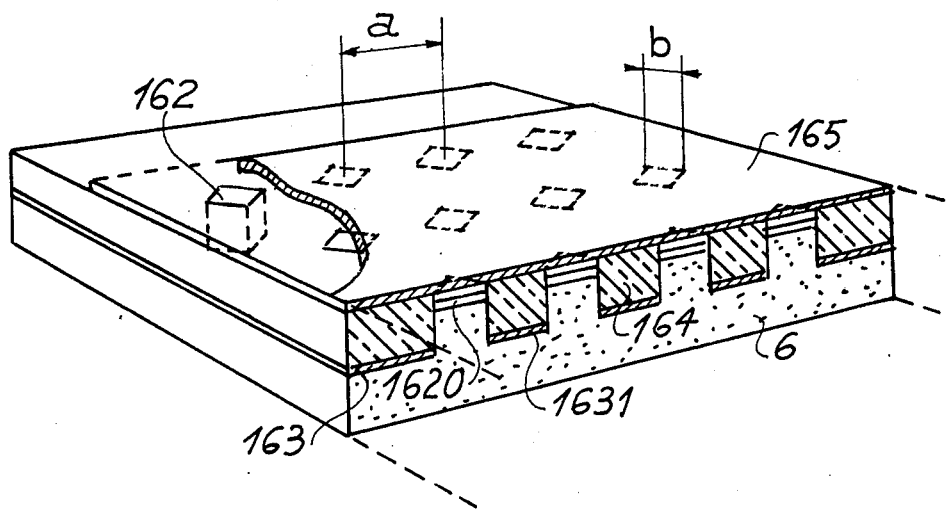
Fig_3a
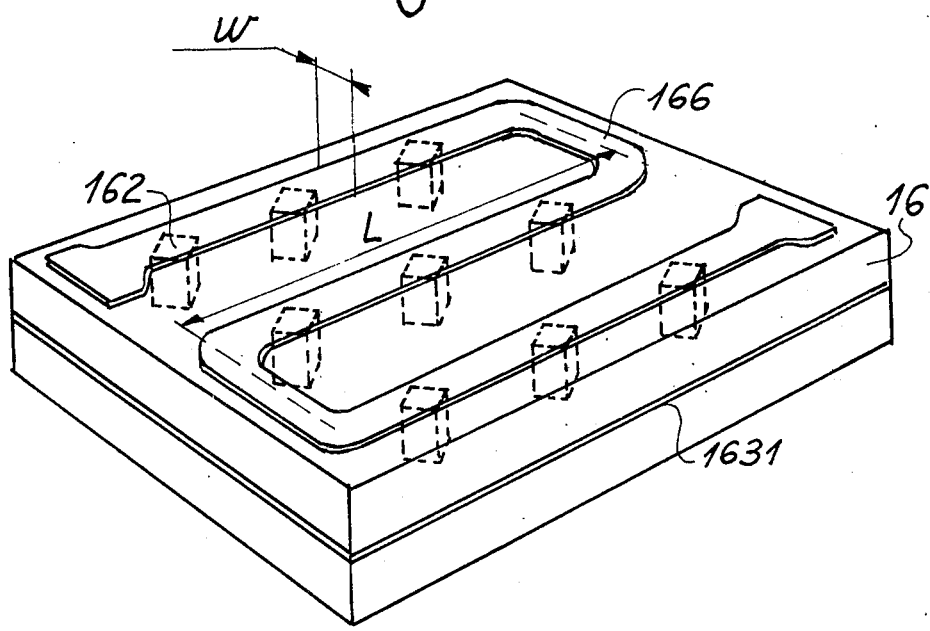
Fig_3b

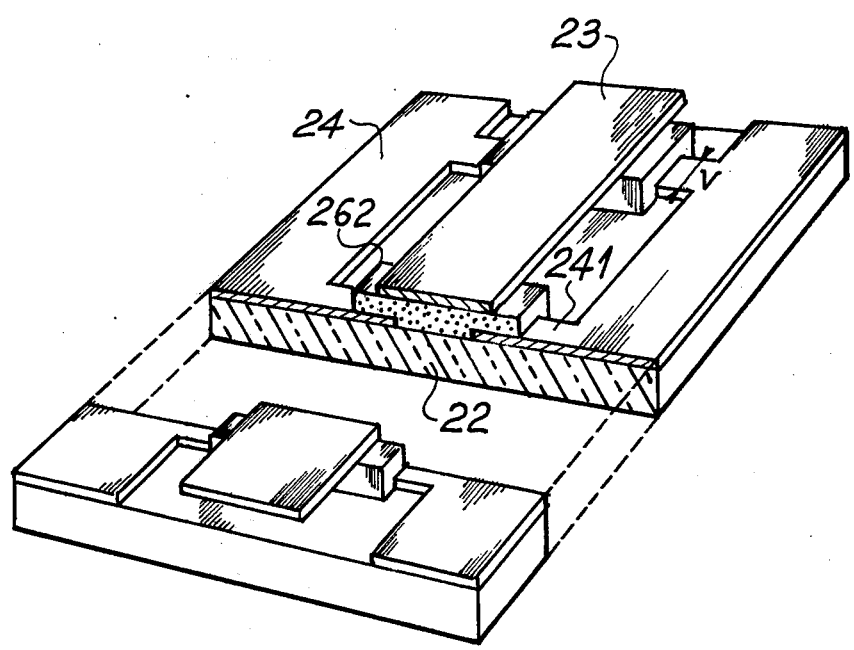
Fig_4

PARAMETRIC COUPLING DEVICE FOR TRAVELING-WAVES

The present invention relates to a parametric coupling device for traveling-waves, in particular for hyperfrequency waves for microwave receivers and to the microwave receiver comprising such a device.

Such devices for parametrically coupling traveling-waves by means of distributed-constant circuits have been described in particular in the publication by W. M. LOUISELL entitled "Coupled Mode and parametric electronics" John WILEY (1960), and in the publication by A. L. CULLEN, PIEE review 107 No. 32 B 101 (1960). Such circuits enable coupling to be effected between a first signal wave and a second wave known by the term of "idler" wave. This coupling is obtained by modulating the conduction properties of a transmission line by way of non-linear interaction elements modulated by a third pump wave. The first signal wave, the second idler wave and the pump wave are propagated on the line.

The dispersion characteristics of the line must satisfy parametric conditions. For three-wave interaction, these conditions are written:

$$\begin{cases} \omega_s + \omega_i = \omega_p \\ \vec{\beta}_s + \vec{\beta}_i = \vec{\beta}_p \end{cases} \quad \text{I}$$

in the case when the parametric coupling device is functioning as a parametric amplifier, and $$\begin{cases} \omega_i + \omega_p = \omega_s \\ \vec{\beta}_i + \vec{\beta}_p = \vec{\beta}_s \end{cases} \quad \text{II}$$

in the case when the parametric coupling device is functioning as a parametric mixer or frequency-converter. In the relationships I and II, $\omega_s$, $\omega_i$, $\omega_p$ represent the pulsations of the signal, idler and pump waves respectively, and $\vec{\beta}_s$, $\vec{\beta}_i$, $\vec{\beta}_p$ the wave vectors for these same waves. The manner in which the device functions in each mode depends on the conditions of filtering of the signals resulting from the parametric coupling.

Coupling devices having localised constants have been described in particular in the article by P. K. TIEN and H. SUHL in the review "Proc IRE 46, 700 (1958)" wherein the interaction between the three aforementioned waves is more stable than for devices using localised elements.

In the field of hyper-frequencies, discrete interaction elements have most often been used within propagation lines. In this case, the propagation lines are complicated and expensive, as said by the article in the publication "Electronics Letters" 11 No. 15,338 (1975) by C. S. AITCHINSON and A. S. WONG. In addition, in order to satisfy the aforementioned parametric conditions and in order to eliminate interfering interactions caused by intermodulations of other orders producing interfering pulsating signals ($\omega p + \omega s$) and ($2\omega p - \omega s$), it is generally necessary to differentiate between lines propagating signal-wave energy and pump-wave energy, this differentiation giving rise to the use of complex structures on the level of the lines.

In addition, existing systems are limited in pass-band width because they are resonant structures for making up the lines.

A subject of the present invention is a parametric coupling device wherein propagation losses are greatly reduced.

Another subject of the present invention is a parametric coupling device of compact structure and great fiability.

Another subject of the present invention is a parametric coupling device having a very high cut-off frequency, of the order of 60 GHz, for which parametric conditions are satisfied over a wide frequency-band, and wherein the product of gain and pass-band width is increased when it is functioning as a parametric amplifier.

According to the invention, the device for parametrically coupling traveling-waves, comprising a first signal wave, a second idler wave and a third pump wave, by modulating the conduction properties of a transmission line by way of non-linear interaction elements modulated by the pump wave, comprises a transmission line formed on a dielectric substrate and comprising a virtually continuous network of non-linear interaction elements enabling intermodulation to be set up between the various traveling-waves.

Such devices may be used in all microwave receivers, and are particularly adapted, regard being had to their small bulk and their great fiability, for use in space or terrestrial telecommunication stations.

The invention will be better understood with the aid of description and drawings hereinafter, wherein the relative dimensions and proportions of the various elements have not been respected in order to confer a better understanding of the whole, and wherein:

FIGS. 1a, 1b and 1c respectively illustrate, in exploded perspective and in section, a device according to the invention, and one particular form of embodiment of this device, FIG. 2 illustrates one particular form of embodiment of a device according to the invention, FIGS. 3a and 3b illustrate a variant of embodiment, in perspective, of the device according to the invention as illustrated in FIG. 2, FIG. 4 illustrates another particular form of embodiment of the device according to the invention.

The parametric coupling device for traveling-waves illustrated in FIG. 1a enables a first signal wave and a second idler wave to be coupled by modulating the conduction properties of a transmission line by way of non-linear interaction elements modulated by a third pump wave. The device according to the invention illustrated in FIG. 1a comprises a transmission line A for traveling-waves formed on a substrate 2 of dielectric material. The transmission line furthermore comprises a virtually continuous network B of non-linear interaction element enabling intermodulation to be set up between the various progressive waves. The virtually continuous network of non-linear interaction elements is a substantially plane network. Each non-linear element is at a distance a, or pitch of the network, from a neighbouring non-linear element, said distance or pitch being less than the smallest of the wavelengths of the signal, idler and pump waves being propagated in the transmission line. The network of non-linear elements is disposed in the neighbourhood of the upper surface of the substrate on which the transmission line is made up. The non-linear interaction elements take the form for example of integrated diodes 4. When functioning, the transmission line A is fed by the signal wave of frequency fs for example and the pump wave of frequency fp. The idler wave of frequency fi is set up in the transmission line, and the three waves, signal, pump and idler, are propagated on the line. The network of non-linear interaction elements, in the form for example of diodes, disposed in the neighbourhood of the upper surface of the transmission line, is subjected to the high-frequency electromagnetic field resulting from propagation of the various waves on the line. In particular, the diodes biased by the high-frequency electric field behave like variable capacities whereof the value is modulated by the instantaneous value of the high-frequency electric field due to propagation of the signals on the line, which enables parametric coupling to be effected between the different waves for which the aforementioned parametric conditions are satisfied. According to the non-limitative form of embodiment of the invention illustrated in FIG. 1a, the transmission line A takes the form of a strip-type line. The strip-type line comprises a metal plate or sole-piece 1 in contact with the lower face of the substrate of dielectric material 2. A metal strip 3 in contact with the upper face of the substrate of dielectric material is disposed in the neighbourhood of the plane network of non-linear interaction elements. The metal strip 3 comprises input and output connecting studs for the signals, not illustrated.

According to FIG. 1b, the plane network of non-linear interaction elements is made up of a panel of integrated diodes 4 on a substrate of semiconductor material 6. The substrate of dielectric material is for example of N+ type silicon. Each diode 4 comprises an N type epitaxiated zone 7 constituting the active zone of each of the diodes and an electrode 8 in contact with the epitaxiated zone 7, and forming therewith a Schottky junction. In the case in which the substrate of semiconductor material 6 is silicon, the electrode 8 consists of platinum in order to form the Schottky junction. The substrate of dielectric material 6 comprises metallising 5 disposed on the face of the substrate comprising the electrodes 8 of the diodes, the metallising leaving each diode and each electrode 8 free to make contact with the upper face of the substrate, the electrodes 8 of the diodes opposite to the metal strip 3 being in ohmic contact with the latter. Ohmic contact between the electrodes 8 and the metal strip 3 is made for example by soldering. According to one particular form of embodiment of the device illustrated in FIG. 1a and FIG. 1b, the diodes have a cylindrical cross-section of mean diameter $\phi$ in the neighbourhood of 10 micrometers, and the distance a between each diode, or the pitch of the network, is of the order of 100 micrometers. Under these conditions, if the substrate of dielectric material has a thickness of ho and a relative dielectric constant of $\epsilon r$, the distance h separating the free face of the metallising 5 from the upper face of the substrate of dielectric material is such that $h \leq ho/10 \times \epsilon r$. The width w of the metal strip 3 is determined having regard to the characteristic impedance the line, the doping or the epitaxied zones and the pitch of the network. The panel of diodes is put into effect starting from a substrate of semiconductor material, silicon of the N+ type for example, by epitaxial growth of an N type layer and then preferential chemical attack by masking and then metallising corresponding zones.

According to a variant of embodiment of the invention shown in FIG. 1c, the panel of diodes comprises mesa diodes. The panel of diodes comprises a substrate of semi-conductor material 6 of the N+ type for example. Each diode comprises an epitaxiated layer 7 or the N type and a P+ doped, for example, contact layer 71. The panel of diodes comprises metallising 5 in the same manner as before. In this example, the diodes are 10 micrometers in diameter, and at a network-pitch distance of 200 micrometers. The panel of diodes is integrated by the operations hereinbefore cited of epitaxial growth of an N type layer, then of a P+ type layer, preferential chemical attack and then metallising of the corresponding zones.

The device illustrated in FIG. 1a functions as follows: The metallising of the substrate of the panel is very close to the metal strip 3. The interstice of air between the metal strip 3 and the metallising 5 of the panel of diodes constitutes a capacity with which the capacities of the diodes are in parallel. The localised hyper-frequency electric fields in this region are orthogonal to the junctions of the diodes, and modulate these capacities. This modulation sets up parametric coupling of the high-frequency waves being propagated on the line by modulation of the conduction properties of this latter.

FIG. 2 illustrates in exploded perspective one particular form of embodiment of a coupling device according to the invention. As shown in FIG. 2, the substrate of dielectric material is integrated with the plane network of non-linear interaction elements. The plane network of non-linear elements comprises a substrate 6 of heavily doped semiconductor material embracing a series of parallel channels 61 bounded by partitions 62 and by a base surface 63. The parallel channels and the partitions are preferably orthogonal to the direction in which the waves are propagating on the line. The base surfaces 63 are situated substantially in the same plane, and the top of the partitions 62 comprises an epitaxiated zone 620. All the epitaxiated zones 620 are situated substantially in the same plane constituting the upper face of the substrate 6 of semiconductor material. The base surfaces 63 comprise metallising 631. The metallising 631 of all the base surfaces 63 constitutes the metal plate of the strip-type line. A series of zones of dielectric material fills the channels 61 and separates the partitions 62, the upper surface of the zones 64 constituting with the tops of the partitions 62 a substantially plane upper surface for the substrate. A metal strip 65 is disposed on the upper surface of the substrate, the large side of the metal strip 65 preferably being perpendicular to the parallel channels 61. The metal strip 65 is in contact with the tops of the partitions 62, and constitutes with each of the epitaxiated zones 620 a Schottky junction. For this purpose, the metal strip 65 consists for example of platinum, the substrate of semiconductor material being silicon. The metal strip 65, the zones 64 of dielectric material and the metallised regions 631 of the base surfaces constitute the strip-type line. According to one particular form of embodiment in accordance with FIG. 2, the partitions 61 have a thickness of the order of 50 micrometers and a height, counting from the base surface 63 to the top of a partition, of the order of 200 micrometers. The pitch a of the network or distance separating the planes of longitudinal symmetry of two consecutive partitions is greater than or equal to 100 micrometers, that is to say a $\geq 100 \mu$. The width w of the metal strip 65 is determined with regard to the characteristic impedance of the line, to the doping of the substrate and of the epitaxiated zones, to the size of the partitions and to the pitch a of the network.

The device as illustrated in FIG. 2 functions in the following manner:

When high-frequency waves are being propagated on the line, the instantaneous high-frequency voltage U existing between the metal strip 65 and the metallised regions 631 constituting, with the zones 64 of dielectric material, the transmission line is entirely transferred to the level of the epitaxiated zone 620 and the corresponding Schottky junction, due to the conduction of the substrate of dielectric material 6 and in particular of the partitions 62. Modulation is applied to the equivalent capacity of the corresponding diode by the instantaneous high-frequency electric field being propagated on the line. This field orthogonal to the Schottky junction constituting the diode enables the conduction properties of the line to be correspondingly modulated, and the signal, pump and idler waves to be parametrically coupled.

The device illustrated in FIG. 2 is put into effect starting from a heavily doped silicon substrate of N+ type for example on which an N type layer is caused to grow by epitaxy. The partitions 62 and the channels 61 are embodied by selective chemical attack by a masking process. The base surfaces 63 situated at the bottom of the channels 61 are then metallised, the metallising serving as a metal plate for the strip-type line. The channels 61 are filled with dielectric material constituting the series of zones 64 of dielectric material separating the partitions 62. The metal strip 65 is then deposited. A metallic strip of platinum is, for example, used when the semiconductor substrate is made of silicon in such a manner as to form a Schottky junction at the level of each epitaxiated zone 620.

The device described and illustrated in FIGS. 1a to 1c and FIG. 2, because of its particular structure and in particular the structure of the metallised regions 5 in the case of FIGS. 1a to 1c and 631 in the case of FIG. 2, yields a reduction in propagation losses and an increase in the product of gain and pass-band when these devices are functioning as parametric amplifiers, the width of the pass-band obtained being of the order of 16/100 of the centre frequency of the pass-band, that is to say a bandwidth of the order of 5 GHz for a centre frequency of 30 GHz.

According to a variant of embodiment of the invention illustrated in FIG. 2, the substrate of dielectric material is integrated with the plane network of non-linear interaction elements according to one particular shape of said network. FIG. 3a illustrates in perspective this variant of embodiment. According to FIG. 3a, the plane network of non-linear interaction elements comprises a substrate of semiconductor material 6. The substrate of semiconductor material comprises a series of studs 162 disposed on a base surface 163. The semiconductor material 6 is for example heavily doped N+ type silicon. The studs 162 are for example of lozenge-shaped section, and comprise an epitaxiated zone 1620 at the end. All the epitaxiated zones 1620 are situated substantially in the same plane constituting the upper face of the substrate. The base surface 163 comprises a metallised region 1631 covering the whole of the base surface free of studs. The metallising 1631 constitutes the metal plate of the strip-type line. A layer 164 of dielectric material separates the studs 162, the upper surface of the layer 164 of dielectric material constituting with the tops of the studs 162 a substantially plane upper face for the substrate. The device comprises a metal strip 165 disposed on the upper surface of the substrate in contact with the tops of the studs 162. The metal strip constitutes with each of the epitaxiated zones 1610 a Schottky junction, and forms with the layer of dielectric material 164 and the metallising 1631 of the base surface 163 the strip-type line. By way of example, the studs have a dimension b of the order of 10 micrometers, and the pitch of the network a is of the order of 100 micrometers. The form of embodiment of FIG. 3a is naturally not limited to the lozenge shape for the cross-section of the studs, no other cross-sectional shape for the studs departing from the scope of the present invention.

The device as illustrated in FIG. 3a functions in a manner similar to the device as illustrated in FIG. 2, the instantaneous high-frequency voltage between the metal strip 165 and the metallising 1631 being entirely transferred to the level of the Schottky junction at the top of each stud due to the propagation of the various waves on the transmission line.

The device as hereinbefore described is particularly advantageous when the transmission line is of the sinuous type as illustrated in FIG. 3b. In this case, a metal strip 166 whereof the width w is of the order of magnitude of the larger cross-sectional dimension of the studs 162, the diagonal of the lozenge according to the non-limitative form of embodiment illustrated in FIG. 3b, covers each stud successively along a path determined in accordance with the direction of propagation of the signals. The choice of a portion of metal strip 166, corresponding to a portion of tansmission line of length $L = \lambda p + s/2$, where $\lambda p + s$, represents the wavelength in the line of the interfering signal, due to interaction between the pump wave fp and the signal wave fs, and enables the interfering signal on a wavelength of $\lambda p + s$ to be eliminated.

According to an advantageous form of embodiment of the present invention illustrated in FIG. 4, the transmission line takes the form of a co-planar line. The co-planar line comprises a substrate of dielectric material 22 having an upper surface and a lower surface. A central metal strip 23 and two metal plates 24 are disposed in contact with the upper face of the substrate, the metal strip 23 being comprised between the two metal plates. The central metal strip 23 and the metal plates 24 are disposed in the neighbourhood of the network of non-linear interaction elements. Each of the metal plates 24 comprises a series of metal fingers 241. The metal fingers of each of the plates 24 are opposite to one another, and preferably orientated perpendicularly to the direction in which the high-frequency waves are propagating in the transmission line.

According to a preferred form of embodiment of the device illustrated in FIG. 4, the substrate of dielectric material is integrated with the plane network of non-linear interaction elements. The network of non-linear interaction elements comprises a series of epitaxiated zones 262 of semiconductor material. All the epitaxiated zones 262 are situated substantially in the same plane constituting the upper face of said substrate. The epitaxiated zones of semiconductor material are disposed between the two metal plates 24, and each partly covers two opposing metal fingers 241. Each epitaxiated zone of semiconductor material constitutes with each of the fingers a Schottky junction. For this purpose, the metal plates, or at least the fingers 241, are made for example of platinum, while the semiconductor material forming the epitaxiated zones 262 is silicon. A central metal strip 23 is disposed on the upper surface of the substrate in ohmic contact with the epitaxiated zones of semiconductor material. The substrate of dielectric material 22, the metal plates 24 and the central metal strip 23 constitute the co-planar line.

By way of an example of embodiment, the fingers 241 have a dimension v in the direction in which the high-frequency waves are propagating in the line, or width, of the order of 20 micrometers. The pitch of the fingers 241, corresponding to the pitch a of the network, is of the order a few millimeters, regard being had to the characteristic impedance of the line, to the doping of the semi-conductor material and to the penetration of the fingers below the central metal strip. The pitch of the fingers 241 is generally less that the wavelength of the pump wave in the transmission line. The semiconductor material used is for example N+ or P+ type doped silicon comprising an epitaxiated layer N.

The device illustrated in FIG. 4 is put into effect by the following operations.

Epitaxial growth of a layer of N type semiconductor material is obtained starting from a P+ doped silicon substrate. An N+ doped substrate of silicon may also be used. A central strip and earth planes comprising the fingers are then deposited on the free face of the epitaxial layer. The deposit is carried out for example by masking and evaporation in vacuo. The metal chosen is such that a Schottky junction with the epitaxiated zone is formed at the level of each finger. The dielectric material is then transferred by pressure under heat to the metallising previously deposited. The dielectric chosen is a low-loss dielectric having a coefficient of expansion near to that of the materials to which it is transferred. The dielectric material chosen is for example a glass, the substrate of semiconductor material and the dielectric material being heated to a temperature of about 600° C. Selective electrochemical attack by a masking process in an acid medium then enables the substrate of P+ type or N+ type semiconductor material to be eliminated, and the N type epitaxiated zones covering two opposing fingers to be preserved. The central metal strip is then deposited for example by evaporation in vacuo. The metal of the central strip is so chosen that it makes ohmic contact with the epitaxiated zones of semiconductor material.

The device described functions in a similar manner to the devices illustrated in FIGS. 2 and 3a, 3b, the Schottky diode formed at the level of each epitaxiated zone between a finger 241 of the metal plates and the central metal strip 22 behaving like a variable capacity modulated by the high-frequency field of the waves propagating in the line.

The parametric coupling device forming the subject of the invention, more particularly in the case of a form of embodiment as illustrated in FIG. 4, is capable of functioning as a low-noise parametric amplifier within a frequency range of 10 GHz to 60 GHz with a pass-band width of the order of 30/100 of the signal frequency fs. The mode of propagation of the waves in the line, a TEM non-dispersive wave yielding a reduction in propagation and conduction losses in the line, associated more particularly with the particular form of embodiment of the diodes in the case of a co-planar line wherein a reduced height of the order of 5 micrometers may be imparted to the epitaxiated zones, enables the cut-off frequency of the whole device to be increased by reducing the series resistance of each of the diodes and their resistive losses.

A reduction in the noise level of the device is obtained by applying it to a d.c. bias voltage between the metal strip in contact with the upper face of the epitaxiated zones and the metal reference plates.

Of course, the invention is not limited to the embodiment described and shown which was given solely by way of example.

What is claimed is:

1. Parametric coupling device for traveling-waves comprising a first signal wave, a second idler wave and a third pump wave, wherein a transmission line for said three traveling-waves is formed on a substrate of dielectric material, which comprises a virtually continuous and substantially plane network of integrated diodes, modulated by the pump wave, and so modulating the conduction properties of the transmission line and enabling intermodulation to be set up between the various traveling-waves, said virtually continuous network of integrated diodes being a substantially plane network, each diode being at a distance a, or pitch of the network, from a neighbouring diode, said distance or pitch being less than the smallest of the wavelengths of the signal, idler, and pump waves, and said plane network being disposed in the neighbourhood of the transmission line.

2. Device according to claim 1 wherein said network of integrated diodes takes the form of a panel of integrated diodes on a substrate of semiconductor material, each diode comprising an active epitaxiated zone and an electrode making contact with said epitaxiated zone, metallising being disposed on the face of the substrate of semiconductor material comprising the electrodes of the diodes, and the electrodes of the diodes being in ohmic contact with a metal strip, supported by a substrate of dielectric material and belonging to the transmission line in form of a strip-type line.

3. Device according to claim 2 wherein said diodes are Schottky diodes, the electrode forming with the epitaxiated zone a Schottky junction.

4. Device according to claim 2 wherein the diodes are mesa diodes.

5. Device according to claim 1 wherein said substrate of dielectric material is integrated with said plane network of integrated diodes, said plane network of integrated diodes comprising:
   a substrate of semiconductor material comprising a series of parallel channels, bounded by partitions and by a base surface, said base surfaces being situated substantially in the same plane, and the top of said partitions comprising an epitaxiated zone, all the epitaxiated zones being situated substantially in the same plane constituting the upper face of the substrate of the semiconductor material;
   metallising of said base surfaces;
   a series of zones of dielectric material separating said partitions and filling said channels, the upper surface of said zones of dielectric material constituting with the tops of said partitions a substantially plane upper face for the substrate;
   a metal strip disposed on the upper surface of said substrate in contact with said tops of the partitions and constituting with each of the epitaxiated zones a Schottky junction, the metal strip, the zones of dielectric material and the metallised regions of the base surfaces constituting a transmission line in form of a strip-type line.

6. Device according to claim 1 wherein said substrate of dielectric material is integrated with said plane network of integrated diodes, said network comprising a substrate of semiconductor material embracing:

a series of studs disposed on a base surface, said studs comprising at the top an epitaxiated zone, all the epitaxiated zones being situated substantially in the same plane constituting the upper face of said substrate;

metallising of said base surface;

a layer of dielectric material separating said studs, the upper face of said layer of dielectric material constituting with the tops of said studs a substantially plane upper face for the substrate;

a metal strip disposed on the upper surface of said substrate in contact with said tops of the studs and constituting with each of the epitaxiated zones a Schottky junction, the metal strip, the layer of dielectric material and the metallising of said base surface forming a transmission line in form a strip-type line.

7. Device according to claim 6 wherein said metal strip, constituting with each of the epitaxiated zones a Schottky junction, forms with the layer of dielectric material and the metallising of said base surface a sinuous transmission line.

8. Parametric coupling device for traveling-waves comprising a first signal wave, a second idler wave and a third pump wave, wherein a transmission line for said three traveling-waves is formed on a substrate of dielectric material, which comprises a virtually continuous and substantially plane network of integrated diodes, modulated by the pump wave, and so modulating the conduction properties of the transmission line and enabling intermodulation to be set up between the various traveling-waves, said virtually continuous network of integrated diodes being a substantially plane network, each diode being at a distance a, or pitch of the network, from a neighbouring diode, said distance or pitch being less than the smallest of the wavelengths of the signal, idler, and pump waves, and said plane network being disposed in the neighbourhood of the transmission line, said transmission line taking the form of a co-planar line comprising:

said substrate of dielectric material having an upper surface and a lower surface;

a central metal strip between two metal plates in contact with said upper face of the dielectric substrate and in the neighbourhood of said plane network of non-linear interaction elements, the metal plates each comprising a series of metal fingers opposite to one another.

9. Device according to claim 8 wherein said substrate of dielectric material is intergrated with said plane network of non-linear interaction elements, said network comprising:

a series of epitaxiated zones of semiconductor material, all the epitaxiated zones being situated substantially in the same plane, constituting the upper face of said dielectric substrate, said zones disposed between the two metal plates each partly covering two opposing metal fingers and constituting with each of them a Schottky junction;

a central metal strip disposed on the upper surface of said dielectric substrate in ohmic contact with said epitaxiated zones of semiconductor material, the substrate of dielectric material, the metal plates and the central metal strip constituting the co-planar line.

* * * * *